United States Patent
Chang (10) Patent No.: US 11,825,629 B2
(45) Date of Patent: Nov. 21, 2023

(54) LIQUID COOLING HEAT EXCHANGE APPARATUS FOR MEMORY MODULES

(71) Applicant: Cooler Master Co., Ltd., Taipei (TW)

(72) Inventor: Ting-jui Chang, Taipei (TW)

(73) Assignee: Cooler Master Co., Ltd., Taipei (TW)

( * ) Notice: Subject to any disclaimer, the term of this patent is extended or adjusted under 35 U.S.C. 154(b) by 280 days.

(21) Appl. No.: 17/475,405

(22) Filed: Sep. 15, 2021

(65) Prior Publication Data

US 2022/0104396 A1 Mar. 31, 2022

(30) Foreign Application Priority Data

Sep. 29, 2020 (TW) ................................ 109133935

(51) Int. Cl.
*F28F 7/00* (2006.01)
*H05K 7/20* (2006.01)
*H05K 1/02* (2006.01)

(52) U.S. Cl.
CPC ....... *H05K 7/20272* (2013.01); *H05K 1/0203* (2013.01); *H05K 7/2039* (2013.01); *H05K 2201/10159* (2013.01)

(58) Field of Classification Search
CPC ............ H05K 7/20272; H05K 1/0203; H05K 7/2039; H05K 2201/10159
USPC ...................................................... 165/80.4
See application file for complete search history.

(56) References Cited

U.S. PATENT DOCUMENTS

| 8,004,841 | B2* | 8/2011 | Cipolla | F28D 15/0233 |
| | | | | 174/15.1 |
| 8,385,067 | B2* | 2/2013 | Arvelo | H05K 7/20772 |
| | | | | 361/679.52 |
| 2008/0024706 | A1* | 1/2008 | Yang | G02F 1/1393 |
| | | | | 349/129 |
| 2013/0120926 | A1* | 5/2013 | Barina | H01L 23/4093 |
| | | | | 165/80.4 |
| 2021/0161033 | A1* | 5/2021 | McEathron | H05K 7/20872 |
| 2022/0104396 | A1* | 3/2022 | Chang | H05K 7/2039 |
| 2023/0047496 | A1* | 2/2023 | Franz | F28F 9/0224 |
| 2023/0070604 | A1* | 3/2023 | Chen | H05K 7/20154 |

(Continued)

FOREIGN PATENT DOCUMENTS

CN 105955434 A 9/2016
TW M509370 U 9/2015

(Continued)

*Primary Examiner* — Claire E Rojohn, III (57) ABSTRACT

A liquid cooling heat exchange apparatus for memory modules comprising a thermal conduction assembly, fastening assembly, and first and second working fluid splitters is provided. The thermal conduction assembly, mounted on the memory nodules via the fastening assembly, comprises a pair of flat flexible conduits, each having at least one fluid passageway communicating with the first and second working fluid splitters, and a pair of cooling spreaders. The pair of flat flexible conduits is in thermal contact with heat producing chips of the memory modules, thermally coupling the first and second working fluid splitters together for transferring heat from the heat producing chips. The pair of cooling spreaders is in thermal contact with the pair of flat flexible conduits for transferring heat from the heat producing chips to the thermal conduction assembly. Each of the at least one fluid passageway is expandable.

20 Claims, 3 Drawing Sheets

(56) References Cited

U.S. PATENT DOCUMENTS

| | | | | |
|---|---|---|---|---|
| 2023/0114730 A1* | 4/2023 | Sprenger | ............... | G06F 1/20 |
| | | | | 165/11.1 |
| 2023/0180379 A1* | 6/2023 | Mardi | ............ | H05K 7/20509 |
| | | | | 361/719 |
| 2023/0180436 A1* | 6/2023 | Bolick | ............ | H05K 7/20772 |
| | | | | 361/699 |

FOREIGN PATENT DOCUMENTS

| | | | |
|---|---|---|---|
| TW | I626532 B | * | 6/2017 |
| TW | I626532 B | | 6/2018 |

* cited by examiner

LIQUID COOLING HEAT EXCHANGE APPARATUS FOR MEMORY MODULES

RELATED APPLICATIONS

The application claims the benefit of priority to Taiwan application no. 109133935, filed on Sep. 29, 2020, of which is incorporated herein by reference in its entirety.

TECHNICAL FIELD

Example embodiments relate generally to the field of heat transfer and, more particularly, to liquid cooling heat exchange apparatuses for cooling memory modules.

BACKGROUND

Cooling for electronic devices, for example, closely spaced electronic circuit cards such as dual in-line memory modules (DIMMs), has traditionally been accomplished by circulating air parallel to the cards. However, with increased functionality and applicability of the electronic devices, power requirements have increased and cooling using air have been become inadequate. Even with the addition of flat metal heat sinks mounted to heat sources of the cards, cooling using air has still proven to be insufficient in meeting the cooling requirements of the more powerful heat producing electronic devices.

Alternative cooling methods include using metal heat pipes within a liquid cooling system. However, these systems are heavier, and given the space limitations between the electronic circuit cards, these systems are also often proprietary. Proprietary systems are more costly to purchase, and time and costs for maintenance and repair are also higher. Metal heat pipes are rigid, and may often damage the cards. Also, within these systems, thermal interface material (TIM) such as thermal grease or paste is typically used to contact with the heat sources of the cards. The thermal paste makes it inconvenient for maintenance or repair in the field, increasing time and costs, and increasing possible damage to the cards, which decreases device reliability and increases device crashes by overheating. This is also true for another type of TIM such as thermal pads with adhesives. Also, thermal pads generally have lower heat conductivity compared to the thermal paste.

SUMMARY

In an embodiment, a liquid cooling heat exchange apparatus for memory modules configured to be flow through by a working fluid, comprising a thermal conduction assembly, a fastening assembly, a first working fluid splitter, and a second working fluid splitter is provided. The thermal conduction assembly is configured to be mounted on the memory modules. The thermal conduction assembly comprises a pair of flat flexible conduits, mutually opposing, parallel, and spaced apart, each, comprising at least one fluid passageway having an inlet end and an outlet end. The at least one fluid passageway is configured to be flow through by the working fluid. Each of the inlet ends and each of the outlet ends are on a same end. The pair of flat flexible conduits is in thermal contact with the memory modules. The fastening assembly comprises at least one securing apparatus configured to secure the thermal conduction assembly to the memory modules. The first and second working fluid splitters is configured to contain and transport the working fluid. The first working fluid splitter comprises a first container body, a first conduit connector, and a first flow through opening. The first conduit connector has a pair of first connector extensions, extending outwardly from the first container body and is in communication therewith. The second working fluid splitter comprises a second container body, a second conduit connector, and a second flow through opening. The second conduit connector has a pair of second connector extensions, extending outwardly from the second container body and is in communication therewith. Each of the inlet ends is mounted to the pair of first connector extensions and each of the outlet ends is mounted to the pair of second connector extensions.

During operation, working fluid travels into the first container body through the first flow through opening and out thereof through the pair of first connector extensions, and into the second container body through the pair of second connector extensions and out thereof through the second flow through opening. The pair of flat flexible conduits is in thermal contact with heat producing chips of the memory modules, thermally coupling the first working fluid splitter with the second working fluid splitter for transferring heat from the heat producing chips. Each of the at least one fluid passageway is expandable.

In some embodiments, the thermal conduction assembly further comprises a pair of cooling spreaders, mutually opposing, parallel, and spaced apart. Each of the pair of cooling spreaders comprises a first side edge, a second side edge, opposite the first side edge, a pair of first spreader through holes disposed near to the first side edge, and a pair of second spreader through holes disposed near to the second side edge. Each of the pair of first spreader through holes and each of the pair of second spreader through holes have a spreader diameter, Each of the pair of cooling spreaders has a spreader width larger than that of a conduit width of each of the pair of flat flexible conduits.

During operation, each of the pair of cooling spreaders is in thermal contact with each of the pair of flat flexible conduits, opposite the heat producing chips and is a part of the thermal conduction assembly, transferring heat from the pair of flat flexible conduits, whereby heat from the heat producing chips is transferred to the thermal conduction assembly.

In certain embodiments, the at least one securing apparatus comprises a pair of clamping systems, each, mounted through the pair of first spreader through holes and pair of second spreader through holes. Each of the pair of clamping systems comprises a tail bar, a head bar, and a pair of rods. The tail bar has a pair of attachment through holes, each of the pair of attachment through holes have a tail bar diameter, wherein the tail bar diameter is the same as the spreader diameter. The head bar has a side clamp comprising a cam wheel and a handle, and a pair of attachment openings. The side clamp is disposed between the pair of attachment openings. Each of the pair of attachment openings have a head bar diameter, wherein the head bar diameter is the same as the tail bar and spreader diameters. The pair of rods, each, have a tail end comprising a head and a head end having a removable stop lock, and a rod diameter. The rod diameter is smaller than the tail bar, head bar and spreader diameter. Each of the pair of rods is configured to be mounted through each of the pair of attachment through holes, each of the pair of first and second cooling spreader through holes and each of the pair of attachment openings via the head end. An outer circumference surface of each of the pair of rods is mounted flush with inner circumference surfaces of the pair of attachment through holes, pair of attachment openings and par of first spreader through holes or pair of second spreader through holes. The thermal conduction assembly is mounted on the memory modules and securely clamped thereto by rotating the cam wheel. The cam wheel, when rotated, is biased to exert pressure on the thermal conduction assembly when in a locked position, simultaneously producing a positive down force.

In certain embodiments, the at least one securing apparatus comprises a U-rail and a guide. The U-rail is integrally formed within each of the pair of cooling spreaders, longitudinally, facing the pair of flat flexible conduits. The guide is integrally formed on each of the pair of flat flexible conduits, longitudinally, opposite the memory modules. The guide is configured to mechanically mate with the U-rail.

In some embodiments, the amount of the memory modules is one or greater and the amount of the pair of flat flexible conduits is one pair or greater. In certain embodiments, the amount of the memory modules is one or greater, the amount of the pair of flat flexible conduits is one pair or greater and the amount of the pair of cooling spreaders is one pair or greater.

In some embodiments, each of the memory modules further comprise a circuit board having a card edge having a plurality of electrical contacts, and the heat producing chips comprise a plurality of memory chips securely mounted to opposing faces of the circuit board. The plurality of electrical contacts is connected to the plurality of memory chips and the card edge is configured to be mounted to a circuit board of an electric or electronic device. The pair of flat flexible conduits is in thermal contact with the plurality of memory chips.

In some embodiments, the working fluid circulates through the first working fluid splitter, at least one fluid passageway and second working fluid splitter in a closed loop for transferring heat to the working fluid from the heat producing chips via the pair of flat flexible conduits.

In some embodiments, the material of the pair of flat flexible conduits comprises thermally conductive plastics. In certain embodiments, the material of the pair of cooling spreaders comprises aluminum, aluminum-alloy, copper, copper-alloy or any combination of the foregoing.

In an embodiment, a system including a liquid cooling heat exchange apparatus for memory modules the liquid cooling heat exchange apparatus configured to be flow through by a working fluid, comprising a circuit board of an electric or electronic device, a thermal conduction assembly, a fastening assembly, a first working fluid splitter, and a second working fluid splitter is provided. The circuit board has at least one memory module slot, extending longitudinally, mutually opposing, parallel, and spaced apart. A memory module is mounted in the at least one memory module slot. The thermal conduction assembly is configured to be mounted on the memory modules. The thermal conduction assembly comprises a pair of flat flexible conduits, mutually opposing, parallel, and spaced apart, each, comprising at least one fluid passageway having an inlet end and an outlet end. The at least one fluid passageway is configured to be flow through by the working fluid, Each of the inlet ends and each of the outlet ends are on a same end. The pair of flat flexible conduits is in thermal contact with the memory modules. The fastening assembly comprises at least one securing apparatus configured to secure the thermal conduction assembly to the memory modules. The first and second working fluid splitters is configured to contain and transport the working fluid. The first working fluid splitter comprises a first container body, a first conduit connector, and a first flow through opening. The first conduit connector has a pair of first connector extensions, extending outwardly from the first container body and is in communication therewith. The second working fluid splitter comprises a second container body, a second conduit connector, and a second flow through opening. The second conduit connector has a pair of second connector extensions, extending outwardly from the second container body and is in communication therewith. Each of the inlet ends is mounted to the pair of first connector extensions and each of the outlet ends is mounted to the pair of second connector extensions.

During operation, working fluid travels into the first container body through the first flow through opening and out thereof through the pair of first connector extensions, and into the second container body through the pair of second connector extensions and out thereof through the second flow through opening. The pair of flat flexible conduits is in thermal contact with heat producing chips of the memory modules, thermally coupling the first working fluid splitter with the second working fluid splitter for transferring heat from the heat producing chips. Each of the at least one fluid passageway is expandable.

In some embodiments of the system, the thermal conduction assembly further comprises a pair of cooling spreaders, mutually opposing, parallel, and spaced apart, Each of the pair of cooling spreaders comprises a first side edge, a second side edge, opposite the first side edge, a pair of first spreader through holes disposed near to the first side edge, and a pair of second spread er through holes disposed near to the second side edge. Each of the pair of first spreader through holes and each of the pair of second spreader through holes have a spreader diameter. Each of the pair of cooling spreaders has a spreader width larger than that of a conduit width of each of the pair of flat flexible conduits.

During operation, each of the pair of cooling spreaders is in thermal contact with each of the pair of flat flexible conduits, opposite the heat producing chips and is a part of the thermal conduction assembly, transferring heat from the pair of flat flexible conduits, whereby heat from the heat producing chips is transferred to the thermal conduction assembly.

In certain embodiments of the system, the at least one securing apparatus comprises a pair of clamping systems, each, mounted through the pair of first spreader through holes and pair of second spreader through holes. Each of the pair of clamping systems comprises a tail bar, a head bar, and a pair of rods. The tail bar has a pair of attachment through holes, each of the pair of attachment through holes have a tail bar diameter, wherein the tail bar diameter is the same as the spreader diameter. The head bar has a side clamp comprising a cam wheel and a handle, and a pair of attachment openings. The side clamp is disposed between the pair of attachment openings. Each of the pair of attachment openings have a head bar diameter, wherein the head bar diameter is the same as the tail bar and spreader diameters. The pair of rods, each, have a tail end comprising a head and a head end having a removable stop lock, and a rod diameter. The rod diameter is smaller than the tail bar, head bar and spreader diameter. Each of the pair of rods is configured to be mounted through each of the pair of attachment through holes, each of the pair of first and second cooling spreader through holes and each of the pair of attachment openings via the head end. An outer circumference surface of each of the pair of rods is mounted flush with inner circumference surfaces of the pair of attachment through holes, pair of attachment openings and par of first spreader through holes or pair of second spreader through holes. The thermal conduction assembly is mounted on the memory modules and securely clamped thereto by rotating the cam wheel. The cam wheel, when rotated, is biased to exert pressure on the thermal conduction assembly when in a locked position, simultaneously producing a positive down force.

In certain embodiments of the system, the at least one securing apparatus comprises a U-rail and a guide. The U-rail is integrally formed within each of the pair of cooling spreaders, longitudinally, facing the pair of flat flexible conduits. The guide is integrally formed on each of the pair of flat flexible conduits, longitudinally, opposite the memory modules. The guide is configured to mechanically mate with the U-rail.

In some embodiments of the system, the amount of the memory modules is one or greater and the amount of the pair of flat flexible conduits is one pair or greater. In certain embodiments of the system, the amount of the memory modules is one or greater, the amount of the pair of flat flexible conduits is one pair or greater and the amount of the pair of cooling spreaders is one pair or greater.

In some embodiments of the system, each of the memory modules further comprise a circuit board having a card edge having a plurality of electrical contacts, and the heat producing chips comprise a plurality of memory chips securely mounted to opposing faces of the circuit board. The plurality of electrical contacts is connected to the plurality of memory chips, and the card edge is configured to be mounted to a circuit board of an electric or electronic device. The pair of flat flexible conduits is in thermal contact with the plurality of memory chips.

In some embodiments of the system, the working fluid circulates through the first working fluid splitter, at least one fluid passageway and second working fluid splitter in a closed loop for transferring heat to the working fluid from the heat producing chips via the pair of flat flexible conduits.

In some embodiments of the system, the material of the pair of flat flexible conduits comprises thermally conductive plastics. In certain embodiments of the system, the material of the pair of cooling spreaders comprises aluminum, aluminum-alloy, copper, copper-alloy or any combination of the foregoing.

BRIEF DESCRIPTION OF THE DRAWINGS

Unless specified otherwise, the accompanying drawings illustrate aspects of the innovative subject matter described herein. Referring to the drawings, wherein like reference numerals indicate similar parts throughout the several views, several examples of water block systems incorporating aspects of the presently disclosed principles are illustrated by way of example, and not by way of limitation.

DETAILED DESCRIPTION

Figure 1:
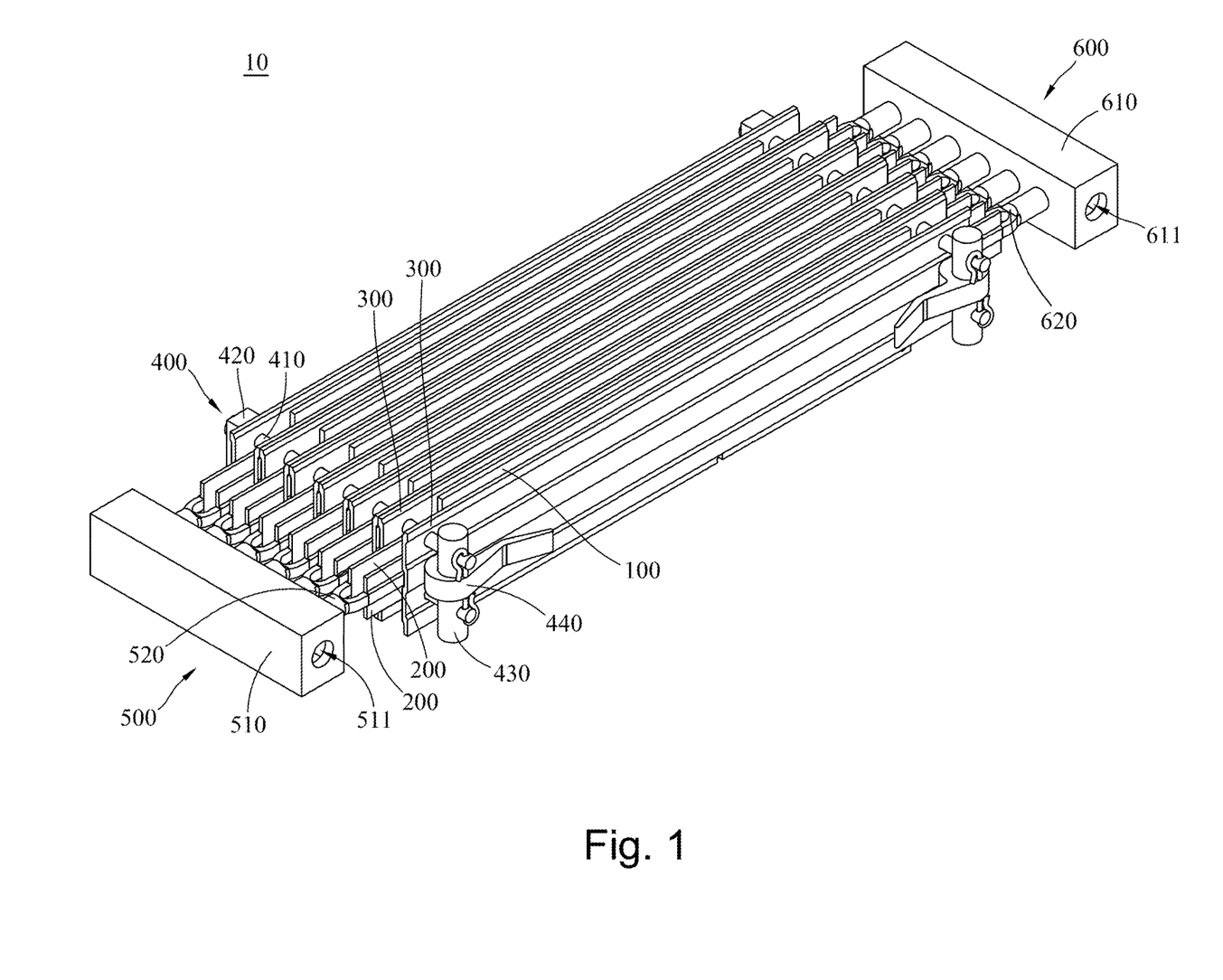
FIG. 1 depicts a representation of an embodiment of a liquid cooling heat exchange apparatus for memory modules.
Figure 2:
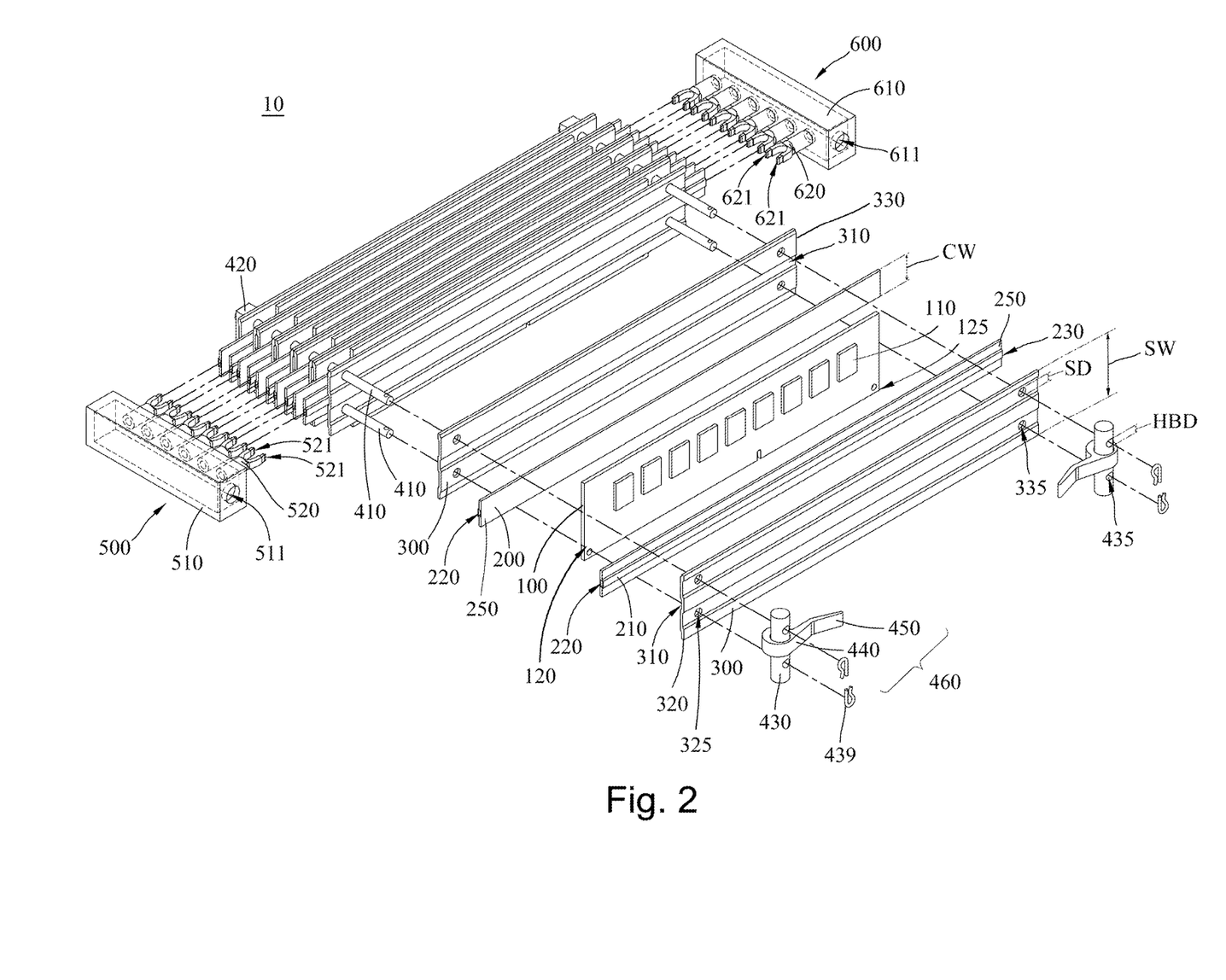
FIG. 2 depicts a partially exploded view of the embodiment of the liquid cooling heat exchange apparatus for memory modules of FIG. 1.
Figure 3:
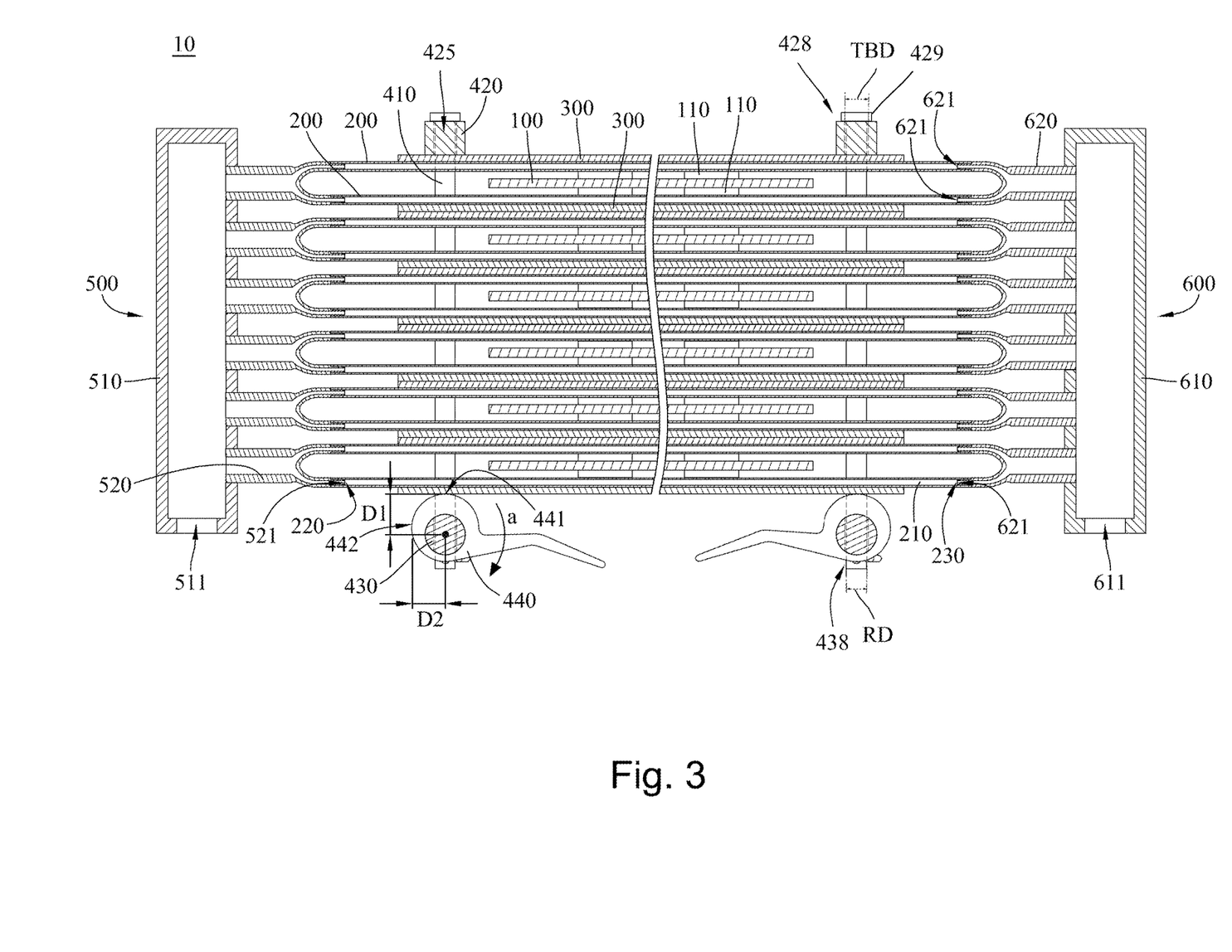
FIG. 3 depicts a partial cross-sectional view of the liquid cooling heat exchange apparatus for memory modules of FIG. 1.

The following describes various principles related to liquid cooling systems by way of reference to specific examples of thermal conduction assembly, including specific arrangements and examples of fastening assemblies and working fluid splitters embodying innovative concepts. More particularly, but not exclusively, such innovative principles are described in relation to selected examples of flat flexible conduits, cooling spreaders and securing apparatuses and well-known functions or constructions are not described in detail for purposes of succinctness and clarity. Nonetheless, one or more of the disclosed principles can be incorporated in various other embodiments of flat flexible conduits, cooling spreaders and securing apparatuses to achieve any of a variety of desired outcomes, characteristics, and/or performance criteria.

Thus, liquid cooling heat exchange apparatus for memory modules having attributes that are different from those specific examples discussed herein can embody one or more of the innovative principles, and can be used in applications not described herein in detail. Accordingly, embodiments not described herein in detail also fall within the scope of this disclosure, as will be appreciated by those of ordinary skill in the relevant art following a review of this disclosure.

Example embodiments as disclosed herein are directed to liquid cooling heat exchange apparatuses for memory modules comprising a thermal conduction assembly, fastening assembly, and first and second working fluid splitters is provided. The thermal conduction assembly, mounted on the memory modules via the fastening assembly, comprises a pair of flat flexible conduits, each having at least one fluid passageway communicating with the first and second working fluid splitters, and a pair of cooling spreaders. The pair of flat flexible conduits is in thermal contact with heat producing chips of the memory modules, thermally coupling the first and second working fluid splitters together for transferring heat from the heat producing chips. The pair of cooling spreaders is in thermal contact with the pair of flat flexible conduits for transferring heat from the heat producing chips to the thermal conduction assembly. Each of the at least one fluid passageway is expandable.

In an embodiment, a liquid cooling heat exchange apparatus 10 for memory modules 100 configured to be flow through by a working fluid, comprising a thermal conduction assembly 200, 300, a fastening assembly, a first working fluid splitter 500, and a second working fluid splitter 600 is provided. The thermal conduction assembly 200, 300 is configured to be mounted on the memory modules 100. The thermal conduction assembly 200, 300 comprises a pair of flat flexible conduits 200, mutually opposing, parallel, and spaced apart, each, comprising at least one fluid passageway 210 having an inlet end 220 and an outlet end 230. The at least one fluid passageway 210 is configured to be flow through by the working fluid. Each of the inlet ends 220 and each of the outlet ends 230 are on a same end. The pair of flat flexible conduits 200 is in thermal contact with the memory modules 100. The fastening assembly comprises at least one securing apparatus 400, 310/210 configured to secure the thermal conduction assembly 200, 300 to the memory modules 100, The first and second working fluid splatters 500, 600 is configured to contain and transport the working fluid. The first working fluid splitter 500 comprises a first container body 510, a first conduit connector 520, and a first flow through opening 511. The first conduit connector 520 has a pair of first connector extensions 521, extending outwardly from the first container body 510 and is in communication therewith. The second working fluid sputter 600 comprises a second container body 610, a second conduit connector 620, and a second flow through opening 611. The second conduit connector 620 has a pair of second connector extensions 621, extending outwardly from the second container body 610 and is in communication therewith. Each of the inlet ends 220 is mounted to the pair of first connector extensions 521 and each of the outlet ends 230 is mounted to the pair of second connector extensions 621.

During operation, working fluid travels into the first container body 510 through the first flow through opening 511 and out thereof through the pair of first connector extensions 521, and into the second container body 610 through the pair of second connector extensions 621 and out thereof through the second flow through opening 611. The pair of flat flexible conduits 200 is in thermal contact with heat producing chips of the memory modules 100, thermally coupling the first working fluid splitter 500 with the second working fluid splitter 600 for transferring heat from the heat producing chips. Each of the at least one fluid passageway 210 is expandable.

The at least one fluid passageway 210 is configured to secure the pair of flat flexible conduits 200 to be in thermal contact with the heat producing chips of the memory modules 100 via working fluid traveling therethrough, biasing the at least one fluid passageway 210 to expand and exert pressure on the heat producing chips of the memory modules 100, simultaneously producing a positive down force. The at least one fluid passageway 210 is configured such that when expanded, pressure is exerted on the heat producing chips of the memory modules 100 to increase heat transfer efficiency between the surfaces of the heat producing chips and the at least one fluid passageway 210 without damaging the heat producing chips of the memory modules 100.

In certain embodiments, each of the pair of flat flexible conduits 200 further comprise a pair of support wings 250, parallel, and spaced apart. The at least one fluid passageway 210 is between the pair of support wings 250, and the pair of supports wings 250 is configured to support the at least one fluid passageway 210 to be in thermal contact with the memory modules 100. The at least one fluid passageway 210 is supported via the thickness and stiffness of the pair of support wings 250 being greater than the thickness and stiffness of the walls of the at least one fluid passageway 210, mitigating loss of thermal contact or misaligned thermal contact during assembly and/or operation of the liquid cooling heat exchange apparatus 10. The pair of support wings 250, supporting the at least one fluid passageway 210 therebetween, may be integrally formed.

In some embodiments, the thermal conduction assembly 200, 300 further comprises a pair of cooling spreaders 300, mutually opposing, parallel, and spaced apart, Each of the pair of cooling spreaders 300 comprises a first side edge 320, a second side edge 330, opposite the first side edge 320, a pair of first spreader through holes 325 disposed near to the first side edge 320, and a pair of second spreader through holes 335 disposed near to the second side edge 330. Each of the pair of first spreader through holes 325 and each of the pair of second spreader through holes 335 have a spreader diameter D. Each of the pair of cooling spreaders 300 has a spreader width SW larger than that of a conduit width CW of each of the pair of flat flexible conduits 200.

During operation, each of the pair of cooling spreaders 300 is in thermal contact with each of the pair of flat flexible conduits 200, opposite the heat producing chips and is a part of the thermal conduction assembly 200, 300, transferring heat from the pair of flat flexible conduits 200, and enlarging a contact surface area for heat dissipation, whereby heat from the heat producing chips is transferred to the thermal conduction assembly 200, 300.

In certain embodiments the at least one securing apparatus 400, 310/210 comprises a pair of clamping systems 400, each, mounted through the pair of first spreader through holes 325 and pair of second spreader through holes 335. Each of the pair of clamping systems 400 comprises a tail bar 420, a head bar 430, and a pair of rods 410. The tail bar 420 has a pair of attachment through holes 425, each of the pair of attachment through holes 425 have a tail bar diameter TBD, wherein the tail bar diameter TBD is the same as the spreader diameter SD. The head bar 430 has a side clamp 460 comprising a cam wheel 440 and a handle 450, and a pair of attachment openings 435. The side clamp 480 is disposed between the pair of attachment openings 435. Each of the pair of attachment openings 435 have a head bar diameter HBD, wherein the head bar diameter HBD is the same as the tail bar and spreader diameters TBD, SD. The pair of rods 410, each, have a tail end 428 comprising a head 429 and a head end 438 having a removable stop lock 439, and a rod diameter RD. The rod diameter RD is smaller than the tail bar 420, head bar 430 and spreader diameter SD. Each of the pair of rods 410 is configured to be mounted through each of the pair of attachment through holes 425, each of the pair of first and second cooling spreader through holes 325, 335 and each of the pair of attachment openings 435 via the head end 438. An outer circumference surface of each of the pair of rods 410 is mounted flush with inner circumference surfaces of the pair of attachment through holes 425, pair of attachment openings 435 and pair of first spreader through holes 325 or pair of second spreader through holes 335. The thermal conduction assembly 200, 300 is mounted on the memory modules 100 and securely clamped thereto by rotating the cam wheel 440. The cam wheel 440, when rotated, is biased to exert pressure on the thermal conduction assembly 200, 300 when in a locked position, simultaneously producing a positive down force. A locking distance D1 from the head bar 430 to a first surface of the cam wheel 440 is greater than a releasing distance D2 from the head bar 430 to a second surface of the cam wheel 440.

In certain embodiments, the at least one securing apparatus 400, 310/210 comprises a U-rail 310 and a guide 210. The U-rail 310 is integrally formed within each of the pair of cooling spreaders 300, longitudinally, facing the pair of flat flexible conduits 200. The guide 210 is integrally formed on each of the pair of flat flexible conduits 200, longitudinally, opposite the memory modules 100. The guide 210 is configured to mechanically mate with the U-rail 310. In the embodiments, the guide 210 and the at least one fluid passageway 210 are the same.

The U-rail 310 and the guide 210 of each of the pair of cooling spreaders 300 is configured to secure the pair of flat flexible conduits 200 to be in thermal contact with heat producing chips of the memory modules 100 via mechanical mating therebetween. The U-rail 310 of each of the pair of cooling spreaders 300 is configured such that the at least one fluid passageway 210 can be expanded therein. The U-rail 310 of each of the pair of cooling spreaders 300 defines a fixed channel, formed, such that working fluid can travel through the pair of first connector extensions 521, at least one fluid passageway 210, and through the pair of second connector extensions 621 without interruption and/or clogging and/or blockage, such that the pair of flat flexible conduits 200, in thermal contact with heat producing chips of the memory modules 100, can thermally couple the first working fluid splitter 500 with the second working fluid splitter 600 for transferring heat from the heat producing chips.

In some embodiments, the amount of the memory modules 100 is one or greater and the amount of the pair of flat flexible conduits 200 is one pair or greater. In certain embodiments, the amount of the memory modules 100 is one or greater, the amount of the pair of flat flexible conduits 200 is one pair or greater and the amount of the pair of cooling spreaders 300 is one pair or greater.

In some embodiments, each of the memory modules 100 further comprise a circuit board 120 having a card edge 125 having a plurality of electrical contacts (not shown), and the heat producing chips comprise a plurality of memory chips 110 securely mounted to opposing faces of the circuit board 120. The plurality of electrical contacts (not shown) is connected to the plurality of memory chips 110, and the card edge 125 is configured to be mounted to a circuit board of an electric or electronic device (not shown). The pair of flat flexible conduits 200 is in thermal contact with the plurality of memory chips 110.

In some embodiments, the working fluid circulates through the first working fluid splitter 500, at least one fluid passageway 210 and second working fluid splitter 600 in a closed loop for transferring heat to the working fluid from the heat producing chips via the pair of flat flexible conduits 200.

In some embodiments, the material of the pair of flat flexible conduits 200 comprises thermally conductive plastics. In certain embodiments, the material of the pair of cooling spreaders 300 comprises aluminum, aluminum-alloy, copper, copper-alloy or any combination of the foregoing.

In certain embodiments, as the at least one fluid passageway 210 is expandable and/or comprise of thermally conductive plastics, each of the inlet ends 220 is mounted to the pair of first connector extensions 521 and each of the outlet ends 230 is mounted to the pair of second connector extensions 621 via stretching and/or heat shrinkage, as examples.

In the embodiments, the plurality of memory chips 110 comprise random access memory chips, of which type is not limited.

In an embodiment, a system including a liquid cooling heat exchange apparatus 10 for memory modules 100, the liquid cooling heat exchange apparatus 10, configured to be flow through by a working fluid, comprising a circuit board of an electric or electronic device (not shown), a thermal conduction assembly 200, 300, a fastening assembly, a first working fluid splitter 500, and a second working fluid splitter 600 is provided. The circuit board 120 has at least one memory module slot (not shown), extending longitudinally, mutually opposing, parallel, and spaced apart. A memory module 100 is mounted in the at least one memory module slot (not shown) The thermal conduction assembly 200, 300 is configured to be mounted on the memory modules 100. The thermal conduction assembly 200, 300 comprises a pair of flat flexible conduits 200, mutually opposing, parallel, and spaced apart, each, comprising at least one fluid passageway 210 having an inlet end 220 and an outlet end 230. The at least one fluid passageway 210 is configured to be flow through by the working fluid. Each of the inlet ends 220 and each of the outlet ends 230 are on a same end. The pair of flat flexible conduits 200 is in thermal contact with the memory modules 100. The fastening assembly comprises at least one securing apparatus 400, 310/210 configured to secure the thermal conduction assembly 200, 300 to the memory modules 100. The first and second working fluid splitters 500, 600 is configured to contain and transport the working fluid. The first working fluid splitter 500 comprises a first container body 510, a first conduit connector 520, and a first flow through opening 511. The first conduit connector 520 has a pair of first connector extensions 521, extending outwardly from the first container body 510 and is in communication therewith. The second working fluid splitter 600 comprises a second container body 610, a second conduit connector 620, and a second flow through opening 611. The second conduit connector 620 has a pair of second connector extensions 621, extending outwardly from the second container body 610 and is in communication therewith. Each of the inlet ends 220 is mounted to the pair of first connector extensions 521 and each of the outlet end 230 is mounted to the pair of second connector extensions 621.

During operation, working fluid travels into the first container body 510 through the first flow through opening 511 and out thereof through the pair of first connector extensions 521, and into the second container body 610 through the pair of second connector extensions 621 and out thereof through the second flow through opening 611. The pair of flat flexible conduits 200 is in thermal contact with heat producing chips of the memory modules 100, thermally coupling the first working fluid splitter 500 with the second working fluid splitter 600 for transferring heat from the heat producing chips. Each of the at least one fluid passageway 210 is expandable.

The at least one fluid passageway 210 is configured to secure the pair of flat flexible conduits 200 to be in thermal contact with the heat producing chips of the memory modules 100 via working fluid traveling therethrough, biasing the at least one fluid passageway 210 to expand and exert pressure on the heat producing chips of the memory modules 100, simultaneously producing a positive down force. The at least one fluid passageway 210 is configured such that when expanded, pressure is exerted on the heat producing chips of the memory modules 100 to increase heat transfer efficiency between the surfaces of the heat producing chips and the at least one fluid passageway 210 without damaging the heat producing chips of the memory modules 100.

In certain embodiments, each of the pair of flat flexible conduits 200 further comprise a pair of support wings 250, parallel, and spaced apart. The at least one fluid passageway 210 is between the pair of support wings 250, and the pair of supports wings 250 is configured to support the at least one fluid passageway 210 to be in thermal contact with the memory modules 100. The at least one fluid passageway 210 is supported via the thickness and stiffness of the pair of support wings 250 being greater than the thickness and stiffness of the walls of the at least one fluid passageway 210, mitigating loss of thermal contact or misaligned thermal contact during assembly and/or operation of the liquid cooling heat exchange apparatus 10. The pair of support wings 250, supporting the at least one fluid passageway 210 therebetween, may be integrally formed.

In some embodiments of the system, the thermal conduction assembly 200, 300 further comprises a pair of cooling spreaders 300, mutually opposing, parallel, and spaced apart. Each of the paw of cooling spreaders 300 comprises a first side edge 320, a second side edge 330, opposite the first side edge 320, a pair of first spreader through holes 325 disposed near to the first side edge 320, and a pair of second spreader through holes 335 disposed near to the second side edge 330. Each of the pair of first spreader through holes 325 and each of the pair of second spreader through holes 335 have a spreader diameter SD. Each of the pair of cooling spreaders 300 has a spreader width SW larger than that of a conduit width CW of each of the pair of flat flexible conduits 200.

During operation, each of the pair of cooling spreaders 300 is in thermal contact with each of the pair of flat flexible conduits 200, opposite the heat producing chips and is a part of the thermal conduction assembly 200, 300, transferring heat from the pair of flat flexible conduits 200, whereby heat from the heat producing chips is transferred to the thermal conduction assembly 200, 300.

In certain embodiments of the system, the at least one securing apparatus 400, 310/210 comprises a pair of clamping systems 400, each, mounted through the pair of first spreader through holes 325 and pair of second spreader through holes 335. Each of the pair of clamping systems 400 comprises a tail bar 420, a head bar 430, and a pair of rods 410, The tail bar 420 has a pair of attachment through holes 425, each of the pair of attachment through holes 425 have a tail bar diameter TBD, wherein the tail bar diameter TBD is the same as the spreader diameter SD. The head bar 430 has a side clamp 460 comprising a cam wheel 440 and a handle 450, and a pair of attachment openings 435. The side clamp 460 is disposed between the pair of attachment openings 435. Each of the pair of attachment openings 435 have a head bar diameter HBD, wherein the head bar diameter HBD is the same as the tail bar 420 and spreader diameter SDs. The pair of rods 410, each, have a tail end 428 comprising a head 429 and a head end 438 having a removable stop lock 439 and a rod diameter RD. The rod diameter RD is smaller than the tail bar 420, head bar 430 and spreader diameter SD. Each of the pair of rods 410 is configured to be mounted through each of the pair of attachment through holes 425, each of the pair of first and second cooling spreader through holes 325, 335 and each of the pair of attachment openings 435 via the head end 438. An outer circumference surface of each of the pair of rods 410 is mounted flush with inner circumference surfaces of the pair of attachment through holes 425, pair of attachment openings 435 and pair of first spreader through holes 325 or pair of second spreader through holes 335. The thermal conduction assembly 200, 300 is mounted on the memory modules 100 and securely clamped thereto by rotating the cam wheel 440. The cam wheel 440, when rotated, is biased to exert pressure on the thermal conduction assembly 200, 300 when in a locked position, simultaneously producing a positive down force. A locking distance D1 from the head bar 430 to a first surface of the cam wheel 440 is greater than a releasing distance D2 from the head bar 430 to a second surface of the cam wheel 440.

In certain embodiments of the system, the at least one securing apparatus 400, 310/210 comprises a U-rail 310 and a guide 210, The U-rail 310 is integrally formed within each of the pair of cooling spreaders 300, longitudinally, facing the pair of flat flexible conduits 200. The guide 210 is integrally formed on each of the pair of flat flexible conduits 200, longitudinally, opposite the memory modules 100. The guide 210 is configured to mechanically mate with the U-rail 310. In the embodiments, the guide 210 and the at least one fluid passageway 210 are the same.

The U-rail 310 and the guide 210 of each of the pair of cooling spreaders 300 is configured to secure the pair of flat flexible conduits 200 to be in thermal contact with heat producing chips of the memory modules 100 via mechanical mating therebetween. The U-rail 310 of each of the pair of cooling spreaders 300 is configured such that the at least one fluid passageway 210 can be expanded therein. The U-rail 310 of each of the pair of cooling spreaders 300 defines a fixed channel, formed, such that working fluid can travel through the pair of first connector extensions 521, at least one fluid passageway 210, and through the pair of second connector extensions 621 without interruption and/or clogging and/or blockage, such that the pair of flat flexible conduits 200, in thermal contact with heat producing chips of the memory modules 100, can thermally couple the first working fluid splitter 500 with the second working fluid splitter 600 for transferring heat from the heat producing chips.

In some embodiments of the system, the amount of the memory modules 100 is one or greater and the amount of the pair of flat flexible conduits 200 is one pair or greater. In certain embodiments of the system, the amount of the memory modules 100 is one or greater, the amount of the pair of flat flexible conduits 200 is one pair or greater and the amount of the pair of cooling spreaders 300 is one pair or greater.

In some embodiments of the system, each of the memory modules 100 further comprise a circuit board 120 having a card edge 125 having a plurality of electrical contacts (not shown), and the heat producing chips comprise a plurality of memory chips 110 securely mounted to opposing faces of the circuit board 120. The plurality of electrical contacts (not shown) is connected to the plurality of memory chips 110, and the card edge 125 is configured to be mounted to a circuit board of an electric or electronic device (not shown), The pair of flat flexible conduits 200 is in thermal contact with the plurality of memory chips 110.

In some embodiments of the system, the working fluid circulates through the first working fluid splitter 500, at least one fluid passageway 210 and second working fluid splitter 600 in a closed loop for transferring heat to the working fluid from the heat producing chips via the pair of flat flexible conduits 200.

In some embodiments of the system, the material of the pair of flat flexible conduits 200 comprises thermally conductive plastics. In certain embodiments of the system, the material of the pair of cooling spreaders 300 comprises aluminum, aluminum-alloy, copper, copper-alloy or any combination of the foregoing.

In certain embodiments, as the at least one fluid passageway 210 is expandable and/or comprise of thermally conductive plastics, each of the inlet ends 220 is mounted to the pair of first connector extensions 521 and each of the outlet ends 230 is mounted to the pair of second connector extensions 621 via stretching and/or heat shrinkage, as examples.

In the embodiments, the plurality of memory chips 110 comprise random access memory chips, of which type is not limited.

In the embodiments, as those skilled in the relevant art may readily appreciate, sealing elements, such as O-rings, may be used at the interface of different components to create a liquid-tight seal and minimize leaks, and fasteners such as screws, bolts, and pins, may be used at the interface of different components for assembly and/or mounting thereamong.

In the embodiments, as those skilled in the relevant art may readily appreciate, working fluid flow through via pumping units, as an example, may be used for the flow of working fluid through the liquid cooling heat exchange apparatus for memory modules.

The working fluid of the liquid cooling system may be any type of working fluid such as water, water with additives such as anti-fungicide, water with additives for improving heat conducting or other special compositions of working fluids such as electrically non-conductive liquids or liquids with lubricant additives or anti-corrosive additives, as known to those of ordinary skill in the relevant art.

Control of the liquid cooling heat exchange apparatus for memory modules 10 driven by AC or DC power, may take place by means of an operative system or like means or the electric and/or electronics system itself, wherein the electric and/or electronics system comprises a means for measuring load and/or temperature of one or more processors, as known to those of ordinary skill in the relevant art. Using the measurement performed by the operative system or a like system eliminates the need for special means for operating the liquid cooling heat exchange apparatus for memory modules 10. Communication between the operative system or a like system and a processor for operating the liquid cooling heat exchange apparatus for memory modules 10 may take place along already established communication links in the system such as a USB-link. Thereby, a real-time communication between the liquid cooling system and liquid cooling heat exchange apparatus for memory modules may be provided without any special means for establishing the communication.

Further control strategies utilizing the operative system or a like system may involve balancing the rotational speed of the liquid cooling heat exchange apparatus for memory modules 10 as a function of the cooling capacity needed, as also known to those of ordinary skill in the relevant art.

In an embodiment, a liquid cooling heat exchange apparatus 10 for memory modules comprising a thermal conduction assembly 200, 300, fastening assembly, and first and Second working fluid splitters 500, 600 is provided. The thermal conduction assembly 200, 300, mounted on the memory modules via the fastening assembly, comprises a pair of flat flexible conduits 200, each having at least one fluid passageway 210 communicating with the first and second working fluid splitters 500, 600, and a pair of cooling spreaders 300. The pair of flat flexible conduits 200 is in thermal contact with heat producing chips of the memory modules 100, thermally coupling the first and second working fluid splitters 500, 600 together for transferring heat from the heat producing chips. The pair of cooling spreaders 300 is in thermal contact with the pair of flat flexible conduits 200 for transferring heat from the heat producing chips to the thermal conduction assembly 200, 300. Each of the at least one fluid passageway 210 is expandable.

Cooling for electronic devices, by circulating air parallel to closely spaced electronic circuit cards such as dual in-line y modules (DIMMs), or by using flat metal heat sinks mounted to heat sources, has proven to be insufficient. Cooling using metal heat pipes within a liquid cooling system are heavy and often proprietary. Proprietary systems are costly, and time and costs for maintenance and repair are high. Metal heat pipes are rigid, and may often damage the cards. Thermal interface material (TIM) such as thermal grease or paste, or thermal pads with adhesives, makes it inconvenient for maintenance or repair in the field, increasing time and costs, and increasing possible damage to the cards, which decreases device reliability and increases device crashes by overheating. Thermal pads generally have lower heat conductivity compared to thermal paste.

The liquid cooling heat exchange apparatus 10 for memory modules and heat removal or transfer methods of the embodiments does not require a rigid surface to be pressed against the plurality of memory chips 110, is not proprietary, uses multiple supporting, securing and fastening methods such that TIMs are not required, and uses multiple thermal conduction methods to efficiently transfer heat away from the plurality of memory chips 110.

In the embodiments, the at least one fluid passageway 210 is expandable and/or comprise of thermally conductive plastics and is not rigid. Thus, damage, due to rigidity, to the plurality of memory chips 110 during assembly and/or operation is mitigated. Also, the expandability of the at least one fluid passageway 210 increases the compatibility of the liquid cooling heat exchange apparatus 10 for all types of memory modules 100, making the liquid cooling heat exchange apparatus 10 less costly than proprietary systems and decreases time and costs for maintenance and repair. The pair of clamping systems 400, U-rail 310 and guide 210, pair of support wings 250, and working fluid traveling through and biasing the at least one fluid passageway 210 to expand and exert pressure on the plurality of memory chips 110, decreases the need for TIMs, increasing convenience for maintenance or repair in the field, decreasing time and costs, and decreasing possible damage to the plurality of memory chips 110, which increases device reliability and decreases device crashes by overheating. Heat transfer efficiency between the surfaces of the plurality of memory chips 110 and the at least one fluid passageway 210 is increased via the expandability of the at least one fluid passageway 210. Also, the thermal coupling of the first working fluid splitter 500 with the second working fluid splitter 600, via the pair of flat flexible conduits 200, in thermal contact with the plurality of memory chips 110, efficiently transfers heat away from the plurality of memory chips 110. The part of cooling spreaders 300, in thermal contact with each of the pair of flat flexible conduits 200, transfer heat from the pair of flat flexible conduits 200, and enlarges a contact surface area for heat dissipation, whereby heat from the plurality of memory chips 110 is transferred to the thermal conduction assembly 200, 300.

The presently disclosed inventive concepts are not intended to be limited to the embodiments shown herein, but are to be accorded their full scope consistent with the principles underlying the disclosed concepts herein, Directions and references to an element, such as "up," "down,", "upper," "lower," "horizontal," "vertical," "left," "right," and the like, do not imply absolute relationships, positions, and/or orientations. Terms of an element, such as "first" and "second" are not literal, but, distinguishing terms. As used herein, terms "comprises" or "comprising" encompass the notions of "including" and "having" and specify the presence of elements, operations, and/or groups or combinations thereof and do not imply preclusion of the presence or addition of one or more other elements, operations and/or groups or combinations thereof. Sequence of operations do not imply absoluteness unless specifically so stated. Reference to an element in the singular, such as by use of the article "a" or "an", is not intended to mean "one and only one" unless specifically so stated, but rather 'one or more'. As used herein, "and/or" means "and" or "or", as well as "and" and "or," As used herein, ranges and subranges mean all ranges including whole and/or fractional values therein and language which defines or modifies ranges and subranges, such as "at least," "greater than," "less than," "no more than," and the like, mean subranges and/or an upper or lower limit. All structural and functional equivalents to the elements of the various embodiments described throughout the disclosure that are known or later come to be known to those of ordinary skill in the relevant art are intended to be encompassed by the features described and claimed herein. Moreover, nothing disclosed herein is intended to be dedicated to the public regardless of whether such disclosure may ultimately explicitly be recited in the claims. No element or concept disclosed herein or hereafter presented shall be construed under the provisions of 35 USC 112f unless the element or concept is expressly recited using the phrase "means for" or "step for".

In view of the many possible embodiments to which the disclosed principles can be applied, we reserve the right to claim any and all combinations of features and acts described herein, including the right to claim all that comes within the scope and spirit of the foregoing description, as well as the combinations recited, literally and equivalently, in the following claims and any claims presented anytime throughout prosecution of this application or any application claiming benefit of or priority from this application.

What is claimed is:

1. A liquid cooling heat exchange apparatus for memory modules configured to be flow through by a working fluid, comprising:
   a thermal conduction assembly, configured to be mounted on the memory modules, comprising:
      a pair of flat flexible conduits, mutually opposing, parallel, and spaced apart, each, comprising at least one fluid passageway, configured to be flow through by the working fluid, having an inlet end and an outlet end, wherein each of the inlet ends and each of the outlet ends are on a same end, and the pair of flat flexible conduits is in thermal contact with the memory modules;
   a fastening assembly, comprising:
      at least one securing apparatus configured to secure the thermal conduction assembly to the memory modules;
      a first working fluid splitter, configured to contain and transport the working fluid, comprising:
         a first container body;
         a first conduit connector, extending outwardly from the first container body and in communication therewith, having a pair of first connector extensions; and
         a first flow through opening; and
      a second working fluid splitter, configured to contain and transport the working fluid, comprising:
         a second container body;
         a second conduit connector, extending outwardly from the second container body and in communication therewith, having a pair of second connector extensions; and
         a second flow through opening,
   wherein each of the inlet ends is mounted to the pair of first connector extensions and each of the outlet ends is mounted to the pair of second connector extensions, and working fluid travels into the first container body through the first flow through opening and out thereof through the pair of first connector extensions, and working fluid travels into the second container body through the pair of second connector extensions and out thereof through the second flow through opening, and
   whereby the pair of flat flexible conduits is in thermal contact with heat producing chips of the memory modules, thermally coupling the first working fluid splitter with the second working fluid splitter for transferring heat from the heat producing chips, and wherein each of the at least one fluid passageway is expandable.

2. The liquid cooling heat exchange apparatus of claim 1, wherein the thermal conduction assembly further comprises:
   a pair of cooling spreaders, mutually opposing, parallel, and spaced apart, each, comprising:
   a first side edge;
   a second side edge, opposite the first side edge;
   a pair of first spreader through holes disposed near to the first side edge; and
   a pair of second spreader through holes disposed near to the second side edge,
      wherein each of the pair of first spreader through holes and each of the pair of second spreader through holes have a spreader diameter,
      wherein each of the pair of cooling spreaders has a spreader width larger than that of a conduit width of each of the pair of flat flexible conduits, and
   whereby each of the pair of cooling spreaders is in thermal contact with each of the pair of flat flexible conduits, opposite the heat producing chips and is a part of the thermal conduction assembly, transferring heat from the pair of flat flexible conduits, whereby heat from the heat producing chips is transferred to the thermal conduction assembly.

3. The liquid cooling heat exchange apparatus of claim 2, herein the at least one securing apparatus comprises:
   a pair of clamping systems, each, mounted through the pair of first spreader through holes and pair of second spreader through holes, comprising:
      a tail bar having a pair of attachment through holes, each of the pair of attachment through holes have a tail bar diameter, the tail bar diameter is the same as the spreader diameter;
      a head bar having a side clamp comprising a cam wheel and a handle, and a pair of attachment openings, the side clamp disposed between the pair of attachment openings, each of the pair of attachment openings have a head bar diameter, the head bar diameter is the same as the tail bar and spreader diameters; and
      a pair of rods, each, having a tail end comprising a head and a head end having a removable stop lock, and a rod diameter, the rod diameter is smaller than the tail bar, head bar and spreader diameters,
   wherein each of the pair of rods is configured to be mounted through each of the pair of attachment through holes, each of the pair of first and second cooling spreader through holes and each of the pair of attachment openings via the head end, and an outer circumference surface of each of the pair of rods is mounted flush with inner circumference surfaces of the pair of attachment through holes, pair of attachment openings and pair of first spreader through holes or pair of second spreader through holes,
   whereby the thermal conduction assembly is mounted on the memory modules and securely clamped thereto by rotating the cam wheel, the cam wheel, when rotated, is biased to exert pressure on the thermal conduction assembly when in a locked position, simultaneously producing a positive down force.

4. The liquid cooling heat exchange apparatus of claim 2, wherein the at least one securing apparatus comprises a U-rail and a guide, the U-rail is integrally formed within each of the pair of cooling spreaders, longitudinally, facing the pair of flat flexible conduits, the guide is integrally formed on each of the pair of flat flexible conduits, longitudinally, opposite the memory modules, wherein the guide is configured to mechanically mate with the U-rail.

5. The liquid cooling heat exchange apparatus of claim 1, wherein the amount of the memory modules is one or greater and the amount of the pair of flat flexible conduits is one pair or greater.

6. The liquid cooling heat exchange apparatus of claim 2, wherein the amount of the memory modules is one or greater, the amount of the pair of flat flexible conduits is one pair or greater and the amount of the pair of cooling spreaders is one pair or greater.

7. The liquid cooling heat exchange apparatus of claim 1, wherein each of the memory modules further comprise a circuit board having a card edge having a plurality of electrical contacts, and the heat producing chips comprise a plurality of memory chips securely mounted to opposing faces of the circuit board, whereby the plurality of electrical contacts is connected to the plurality of memory chips, and the card edge is configured to be mounted to a circuit board of an electric or electronic device, and whereby the pair of flat flexible conduits is in thermal contact with the plurality of memory chips.

8. The liquid cooling heat exchange apparatus of claim 1, wherein the working fluid circulates through the first working fluid splitter, at least one fluid passageway and second working fluid splitter in a closed loop for transferring heat to the working fluid from the heat producing chips via the pair of flat flexible conduits.

9. The liquid cooling heat exchange apparatus of claim 1, wherein the material of the pair of flat flexible conduits comprises thermally conductive plastics.

10. The liquid cooling heat exchange apparatus of claim 2, wherein the material of the pair of cooling spreaders comprises aluminum, aluminum-alloy, copper, copper-alloy or any combination of the foregoing.

11. A system including a liquid cooling heat exchange apparatus for memory modules, the liquid cooling heat exchange apparatus configured to be flow through by a working fluid, the system comprising:
a circuit board of an electric or electronic device having at least one memory module slot, extending longitudinally, mutually opposing, parallel, and spaced apart, whereby a memory module is mounted in the at least one memory module slot,
a thermal conduction assembly, configured to be mounted on the memory modules, comprising:
a pair of flat flexible conduits, mutually opposing, parallel, and spaced apart, each, comprising at least one fluid passageway, configured to be flow through by the working fluid, having an inlet end and an outlet end, wherein each of the inlet ends and each of the outlet ends are on a same end, and the pair of flat flexible conduits is in thermal contact with the memory modules;
a fastening assembly, comprising:
at least one securing apparatus configured to secure the thermal conduction assembly to the memory modules;
a first working fluid splitter, configured to contain and transport the working fluid, comprising:
a first container body;
a first conduit connector, extending outwardly from the first container body and in communication therewith, having a pair of first connector extensions; and
a first flow through opening; and
a second working fluid splitter, configured to contain and transport the working fluid, comprising:
a second container body;
a second conduit connector, extending outwardly from the second container body and in communication therewith, having a pair of second connector extensions; and
a second flow through opening,
wherein each of the inlet ends is mounted to the pair of first connector extensions and each of the outlet ends is mounted to the pair of second connector extensions, and working fluid travels into the first container body through the first flow through opening and out thereof through the pair of first connector extensions, and working fluid travels into the second container body through the pair of second connector extensions and out thereof through the second flow through opening, and whereby the pair of flat flexible conduits is in thermal contact with heat producing chips of the memory modules, thermally coupling the first working fluid splitter with the second working fluid splitter for transferring heat from the heat producing chips, and wherein each of the at least one fluid passageway is expandable.

12. The system including a liquid cooling heat exchange apparatus of claim 11, wherein the thermal conduction assembly further comprises:
a pair of cooling spreaders, mutually opposing, parallel, and spaced apart, each, comprising:
a first side edge;
a second side edge, opposite the first side edge;
a pair of first spreader through holes disposed near to the first side edge; and
a pair of second spreader through holes disposed near to the second side edge,
wherein each of the pair of first spreader through holes and each of the pair of second spreader through holes have a spreader diameter,
wherein each of the pair of cooling spreaders has a spreader width larger than that of a conduit width of each of the pair of flat flexible conduits, and
whereby each of the pair of cooling spreaders is in thermal contact with each of the pair of flat flexible conduits, opposite the heat producing chips and is a part of the thermal conduction assembly, transferring heat from the pair of flat flexible conduits, whereby heat from the heat producing chips is transferred to the thermal conduction assembly.

13. The system including a liquid cooling heat exchange apparatus of claim 12, wherein the at least one securing apparatus comprises:
a pair of clamping systems, each, mounted through the pair of first spreader through holes and pair of second spreader through holes, comprising:
a tail bar having a pair of attachment through holes, each of the pair of attachment through holes have a tail bar diameter, the tail bar diameter is the same as the spreader diameter;
a head bar having a side clamp comprising a cam wheel and a handle, and a pair of attachment openings, the side clamp disposed between the pair of attachment openings, each of the pair of attachment openings have a head bar diameter, the head bar diameter is the same as the tail bar and spreader diameters; and
a pair of rods, each, having a tail end comprising a head and a head end having a removable stop lock, and a rod diameter, the rod diameter is smaller than the tail bar, head bar and spreader diameters,
wherein each of the pair of rods is configured to be mounted through each of the pair of attachment through holes, each of the pair of first and second cooling spreader through holes and each of the pair of attachment openings via the head end, and an outer circumference surface of each of the pair of rods is mounted flush with inner circumference surfaces of the pair of attachment through holes, pair of attachment openings and pair of first spreader through holes or pair of second spreader through holes,
whereby the thermal conduction assembly is mounted on the memory modules and securely clamped thereto by rotating the cam wheel, the cam wheel, when rotated, is biased to exert pressure on the thermal conduction assembly when in a locked position, simultaneously producing a positive down force.

14. The system including a liquid cooling heat exchange apparatus of claim 12, wherein the at least one securing apparatus comprises a U-rail and a guide, the U-rail is integrally formed within each of the pair of cooling spreaders, longitudinally, facing the pair of flat flexible conduits, the guide is integrally formed on each of the pair of flat flexible conduits, longitudinally, opposite the memory modules, wherein the guide is configured to mechanically mate with the U-rail.

15. The system including a liquid cooling heat exchange apparatus of claim 11, wherein the amount of the memory modules is one or greater and the amount of the pair of flat flexible conduits is one pair or greater.

16. The system including a liquid cooling heat exchange apparatus of claim 12, wherein the amount of the memory modules is one or greater, the amount of the pair of flat flexible conduits is one pair or greater and the amount of the pair of cooling spreaders is one pair or greater.

17. The system including a liquid cooling heat exchange apparatus of claim 11, wherein each of the memory modules further comprise a circuit board having a card edge having a plurality of electrical contacts, and the heat producing chips comprise a plurality of memory chips securely mounted to opposing faces of the circuit board, whereby the plurality of electrical contacts is connected to the plurality of memory chips, and the card edge is configured to be mounted to a circuit board of an electric or electronic device, and whereby the pair of flat flexible conduits is in thermal contact with the plurality of memory chips.

18. The system including a liquid cooling heat exchange apparatus of claim 11, wherein the working fluid circulates through the first working fluid splitter, at least one fluid passageway and second working fluid splitter in a closed loop for transferring heat to the working fluid from the heat producing chip via the pair of flat flexible conduits.

19. The system including a liquid cooling heat exchange apparatus of claim 11, wherein the material of the pair of flat flexible conduits comprises thermally conductive plastics.

20. The system including a liquid cooling heat exchange apparatus of claim 12, wherein the material of the pair of cooling spreaders comprises aluminum, aluminum-alloy, copper, copper-alloy or any combination of the foregoing.

\* \* \* \* \*